United States Patent
Gospodinova-Daltcheva et al.

(10) Patent No.: US 8,143,714 B2
(45) Date of Patent: Mar. 27, 2012

(54) INTEGRATED CIRCUIT AND METHOD FOR PRODUCING THE SAME

(75) Inventors: Minka Gospodinova-Daltcheva, München (DE); Ingo Wennemuth, Munich (DE); Hayri Burak Goekgoez, Munich (DE)

(73) Assignee: Qimonda AG, Munich (DE)

( * ) Notice: Subject to any disclaimer, the term of this patent is extended or adjusted under 35 U.S.C. 154(b) by 699 days.

(21) Appl. No.: 12/054,126

(22) Filed: Mar. 24, 2008

(65) Prior Publication Data

US 2008/0230910 A1   Sep. 25, 2008

(30) Foreign Application Priority Data

Mar. 24, 2007   (DE) .................. 10 2007 014 198

(51) Int. Cl.
*H01L 23/48* (2006.01)
*H01L 23/52* (2006.01)

(52) U.S. Cl. ........................ 257/691; 257/773

(58) Field of Classification Search .......... 257/207, 257/208, 691, 692, 773, E23.141
See application file for complete search history.

(56) References Cited

U.S. PATENT DOCUMENTS

| | | | |
|---|---|---|---|
| 4,900,695 A * | 2/1990 | Takahashi et al. | 438/625 |
| 7,589,379 B2 * | 9/2009 | Amaratunga et al. | 257/347 |
| 2004/0155322 A1 | 8/2004 | Cho et al. | |
| 2004/0232543 A1 | 11/2004 | Goller et al. | |
| 2006/0197220 A1 | 9/2006 | Beer | |
| 2008/0150082 A1 * | 6/2008 | Zupac et al. | 257/565 |

FOREIGN PATENT DOCUMENTS

DE   102005001590   7/2006
DE   102005006995   8/2006

* cited by examiner

*Primary Examiner* — Hung Vu
(74) *Attorney, Agent, or Firm* — Patterson & Sheridan, LLP

(57) ABSTRACT

An integrated circuit provides a carrier substrate, a wiring level above a carrier substrate, wherein the wiring level comprises a first conductor track composed of a first conductive material and a second conductor track composed of the first conductive material, an insulating layer above the wiring level, wherein the insulating layer comprises a first opening in a region of the first conductor track of the wiring level and a second opening in a region of the second conductor track of the wiring level and a contact bridge composed of a second conductive material, wherein the contact bridge is connected to the first conductor track in a region of the first opening and is connected to the second conductor track in a region of the second opening.

9 Claims, 6 Drawing Sheets

INTEGRATED CIRCUIT AND METHOD FOR PRODUCING THE SAME

CROSS-REFERENCE TO RELATED APPLICATIONS

This application claims foreign priority benefits under 35 U.S.C. §119 to co-pending German patent application number DE 10 2007 014 198.1-33, filed 24 Mar. 2007. This related patent application is herein incorporated by reference in its entirety.

BACKGROUND OF THE INVENTION

Integrated circuits, such as e.g. microprocessors, memory components, logic components or other analogue or digital circuits, are nowadays produced in series in large quantities, often in the form of a semiconductor chip in a housing. The chip, comprising for example a semiconductor substrate composed of silicon, in this case comprises the actual functional circuit which was realized by a combination of lithography and patterning methods in the chip. The housing furthermore affords possibilities for making electrical and/or optical contact with integrated circuit components, further functional elements, such as e.g. in the case of system in package, and/or a sealing of the integrated circuit components with respect to moisture or other environmental influences. Highly developed processes, such as the CMOS process, for example, generally serve as production processes for the integrated circuit.

Primarily in the case of large scale integrated digital circuits, such as microprocessors and data memories, the miniaturization of the feature sizes is the subject of intensive industrial and scientific research and development. The miniaturization of the feature sizes enables more functional units to be accommodated in the integrated circuit, which significantly increases the overall performance of the integrated circuit. Thus, by way of example, the storage capacity, that is to say the number of memory cells present, is a critical variable for a modern memory component. Furthermore, the current consumption and speed also play a significant part in the miniaturization of the feature sizes.

Electronic components and circuits generally have a maximum permissible operating voltage or signal voltage. If this maximum voltage is exceeded, for example as a result of an electrostatic discharge, even just momentarily, parts of the circuit or even the entire circuit itself can be destroyed. In this context reference is also made to ESD protection measures (electrostatic discharge) for protecting integrated circuits against such discharges. In addition to the customary measures during production, sales distribution, and during processing of the integrated circuits, direct ESD protection measures are also employed in the integrated. These also include for example the short-circuiting with associated connections of the integrated circuit by housing parts, for example conductor tracks of a carrier substrate. Since, with increasing integration and miniaturization of the feature sizes, there is also an increase in the effective resistances of the conductor tracks on the integrated circuit, a discharge current can lead to correspondingly higher internal voltages. A corresponding short circuit, for example of two supply voltage lines that are to be kept at the same target potential, can avoid such high internal voltage.

The short-circuiting of connections of an integrated circuit can therefore be effected, as already known, by means of additional conductor tracks in the carrier substrate. However, this requires at least two mutually independent wiring levels in the carrier substrate. This necessity results from the fact that the short circuit must be effected without any crossover with other signal lines of a first wiring level by a conductor track of a second wiring level. However, providing a plurality of wiring levels in a carrier substrate leads to more complicated production of the integrated circuit. The high costs associated with the complicated production cannot be tolerated, however in certain applications, such as, for example, a so-called commodity memory component with a standardized FBGA BOC solder ball connection. Commodity memory components are generally employed as a mass-produced product in consumer goods.

BRIEF DESCRIPTION OF THE DRAWINGS

The features of implementations will become clear from the following description, taking in conjunction with the accompanying drawings. It is to be noted, however, that the accompanying drawings illustrate only typical implementations and are, therefore, not to be considered limiting of the scope of the invention. It may admit other equally effective implementations.

DETAILED DESCRIPTION OF THE PREFERRED EMBODIMENT

The present invention relates to an integrated circuit and to a method for producing an integrated circuit.

Embodiments of the invention provide an integrated circuit that provides a carrier substrate and a wiring level above a carrier substrate, wherein the wiring level comprises a first conductor track composed of a first conductive material and a second conductor track composed of the first conductive material. The integrated circuit further provides an insulating layer above the wiring level, wherein the insulating layer comprises a first opening in a region of the first conductor track of the wiring level and a second opening in a region of the second conductor track of the wiring level. The integrated circuit further provides a contact bridge composed of a second conductive material, wherein the contact bridge is connected to the first conductor track in a region of the first opening and is connected to the second conductor track in a region of the second opening.

Another embodiment provides a method for producing an integrated circuit that includes a carrier substrate, providing a wiring level above the carrier substrate, wherein the wiring level comprises a first conductor track composed of a first conductive material and a second conductor track composed of the first conductive material. The method further provides an insulating layer above the wiring level, wherein the insulating layer comprises a first opening in a region of the first conductor track of the wiring level and a second opening in a region of the second conductor track of the wiring level. The method further provides a contact bridge composed of a second conductive material, wherein the first conductor track is connected to the second conductor track in a region of the second opening by means of the contact bridge in a region of the first opening.

Figure 1A:
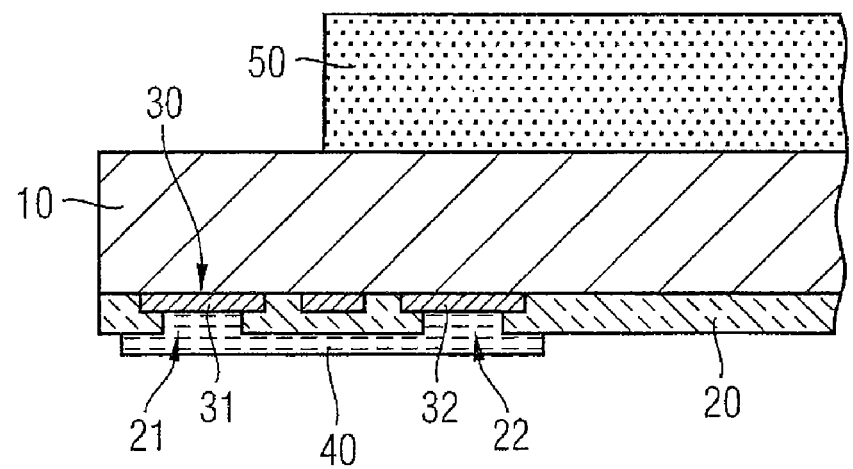
FIG. 1A shows a schematic side view of an integrated circuit according to one embodiment of the present invention.

FIG. 1A shows a schematic side view of an integrated circuit in accordance with one embodiment of the present invention. In this case, an integrated circuit component 50 may be arranged above a carrier substrate 10. Furthermore, a wiring level 30 having a first conductor track 31 and a second conductor track 32 may be arranged above the carrier substrate 10. An insulating layer 20 may be arranged above the wiring level 30 and above the carrier substrate 10. The insulating layer 20 may comprise a first opening 21 in a region of the first conductor track 31 and a second opening 22 in a region of the second conductor track 32. A contact bridge 40 may make contact with the first conductor track 31 in a region of the first opening 21 and the second conductor track 32 in a region of the second opening 22 of the insulating layer 20.

The integrated circuit component 50 can have a semiconductor substrate, for example, in which electronic and/or optical functional units were realized by a series of lithography and patterning techniques. In this case, functional units comprise for example transistors, resistors, capacitors, diodes, light emitters, light sensors, conductor tracks and/or other functional units as known from semiconductor technology. The integrated circuit component 50 can furthermore comprise for example a large scale integrated electronic data memory, such as, for example, a DRAM, PC-RAM, CB-RAM, Flash RAM or MRAM unit.

The carrier substrate 10 can comprise an insulating plastic, such as an epoxy resin for example. The wiring level 30 may be arranged above the carrier substrate 10; the wiring level 30 can be realized for example by application and patterning of a metal film. This can be effected for example in the sense of a printed circuit composed of a copper layer. The insulating layer 20 may be applied to the wiring level 30.

The insulating layer 20 may comprise the openings 21, 22 in order to enable an electrical contact with the conductor tracks 31, 32 of the wiring level 30. The insulating layer 20 can furthermore have further openings in order to enable further contact with the conductor tracks 31, 32 or other conductor tracks. The insulating layer 20 can furthermore comprise a soldering resist paste that prevents the wetting of a metal solder of the conductor tracks of the wiring level 30 outside the openings. In this case, a soldering resist paste of this type can have insulating granules such as, for example, aluminum oxide or silicon oxide. In accordance with one embodiment of the present invention, the insulating layer 20 can be printed on in a simple manner in the form of a soldering resist paste. This can be effected by means of a screen printing method, or by means of selective spraying on through one or more nozzles.

The contact bridge 40 may be applied above the insulating layer 20, said contact bridge 40 connecting the first conductor track 31 to the second conductor track 32. It is thus possible to provide a low-resistance connection for conducting away currents and to effectively prevent the occurrence of harmful voltage in the integrated circuit component 50. In this case, the contact bridge 40 composed of a second conductive material can have a conductive adhesive, such as conductive silver for example. The conductive adhesive can likewise be applied simply and cost-effectively as a pasty medium, for example by means of a printing method. The use of conductive silver furthermore prevents the contact bridge 40 from running or melting during subsequent high-temperature processes having the task for example of soldering the conductor tracks of the wiring level 30 using a metal solder. Examples thereof are reflow, infrared or flow soldering processes.

Figure 1B:
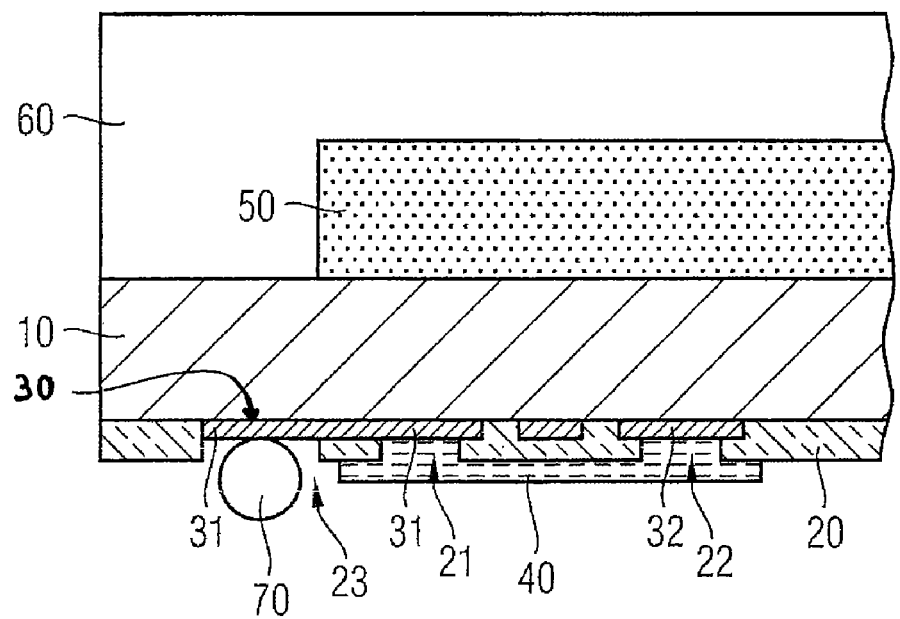
FIG. 1B shows a schematic side view of an integrated according to another embodiment of the present invention.

FIG. 1B shows a schematic side view of an integrated circuit in accordance with another embodiment of the present invention. The elements bearing reference symbols that have already been introduced were described in connection with FIG. 1A. In accordance with this embodiment, the integrated circuit may comprise a housing 60 extending, at least partially, to the integrated circuit component 50 and to the carrier substrate 10. The housing 60 can have a synthetic resin, such as epoxy resin for example. The housing 60 may serve to protect the integrated circuit component 50 against mechanical, thermal and/or electrical effects from outside or against moisture.

The insulating layer 20 may furthermore comprise a third opening 23, which may permit a further contact-connection of the first conductor track 31 of the wiring level 30. A solder ball 70 may be applied in a region of the third opening 23. Customary metal solders have an alloy of one or more of the following metals copper, silver, lead, tin, and/or bismuth. Furthermore, the solder ball 70 can have a flux that enables an advantageous flowing and a reliable contact-connection of the conductor track 31 to a further printed circuit with the aid of the solder ball 70. The insulating layer 20 can furthermore have a soldering resist paste that prevents the undesired flowing of the solder ball 70 outside a region of the third opening 23.

In one embodiment, the integrated circuit can be applied to a printed circuit, and be subjected to a soldering process, such as, for example, a reflow, infrared or flow soldering process. In this case, the solder ball 70 melts and contact-connects the integrated circuit to other electronic units of a circuit system, such as, for example, of a motherboard or of a computer. In this embodiment, the second conductive material of the contact bridge 40 does not melt during this process and is preserved in a stable fashion. It is therefore ensured that, on the one hand, the contact bridge 40 reliably remains and, on the other hand, a undesired short circuit of soldering connections is prevented.

By providing in accordance with the embodiments illustrated in FIGS. 1A and 1B of the present invention a wiring level having conductor tracks composed of a first conductive material and a contact bridge composed of a second conductive material, the contact bridge can be provided significantly more expediently in an integrated component. A second, complicated wiring level on the carrier substrate becomes unnecessary, a contact bridge enabling an electrical connection of two or more conductor tracks of the wiring level, for example in order to realize ESD protection measures. Supply lines on a chip can have a high resistance, in particular with increasing miniaturization of the feature sizes. Said resistance can exceed 1 ohm, where an effective resistance is to be kept much less than 1 ohm. The contact bridge can provide a short circuit that lowers the effective resistance to far less than 1 ohm ($<<1\Omega$). However, the component or method according to the invention is not intended to be restricted to components having only one wiring level, since the provision of the contact bridge generally saves a further wiring level even if e.g. two, three, four or more wiring levels are already provided.

Figure 2A:
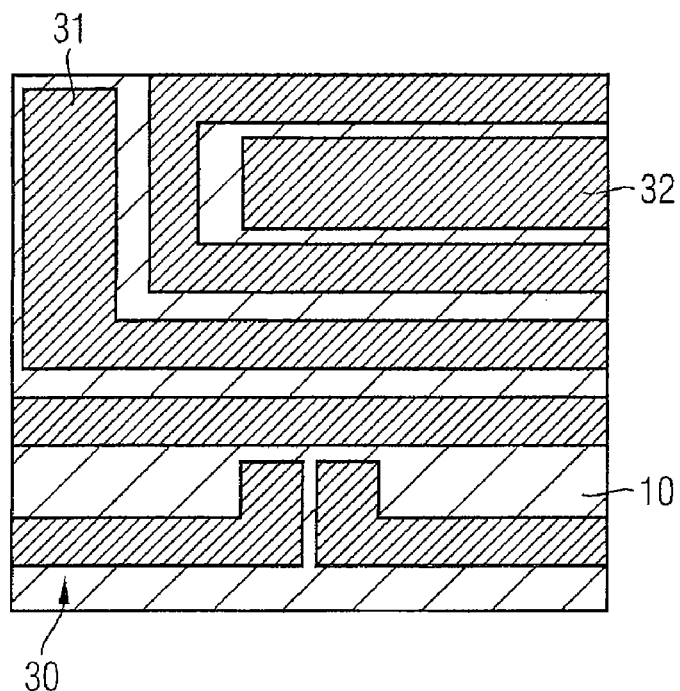
FIGS. 2A to 2C show a schematic plan view the integrated circuit according to the embodiment illustrated in FIG. 1A in different stages during production.
Figure 2B:
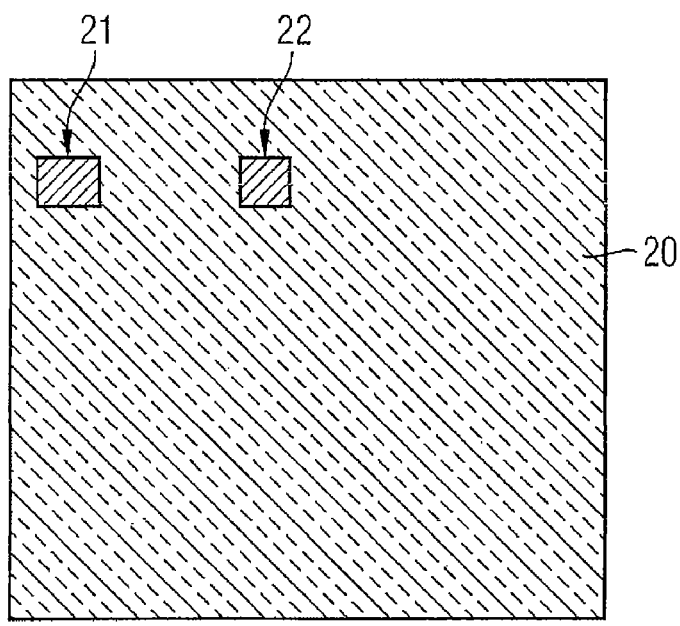
Figure 2C:
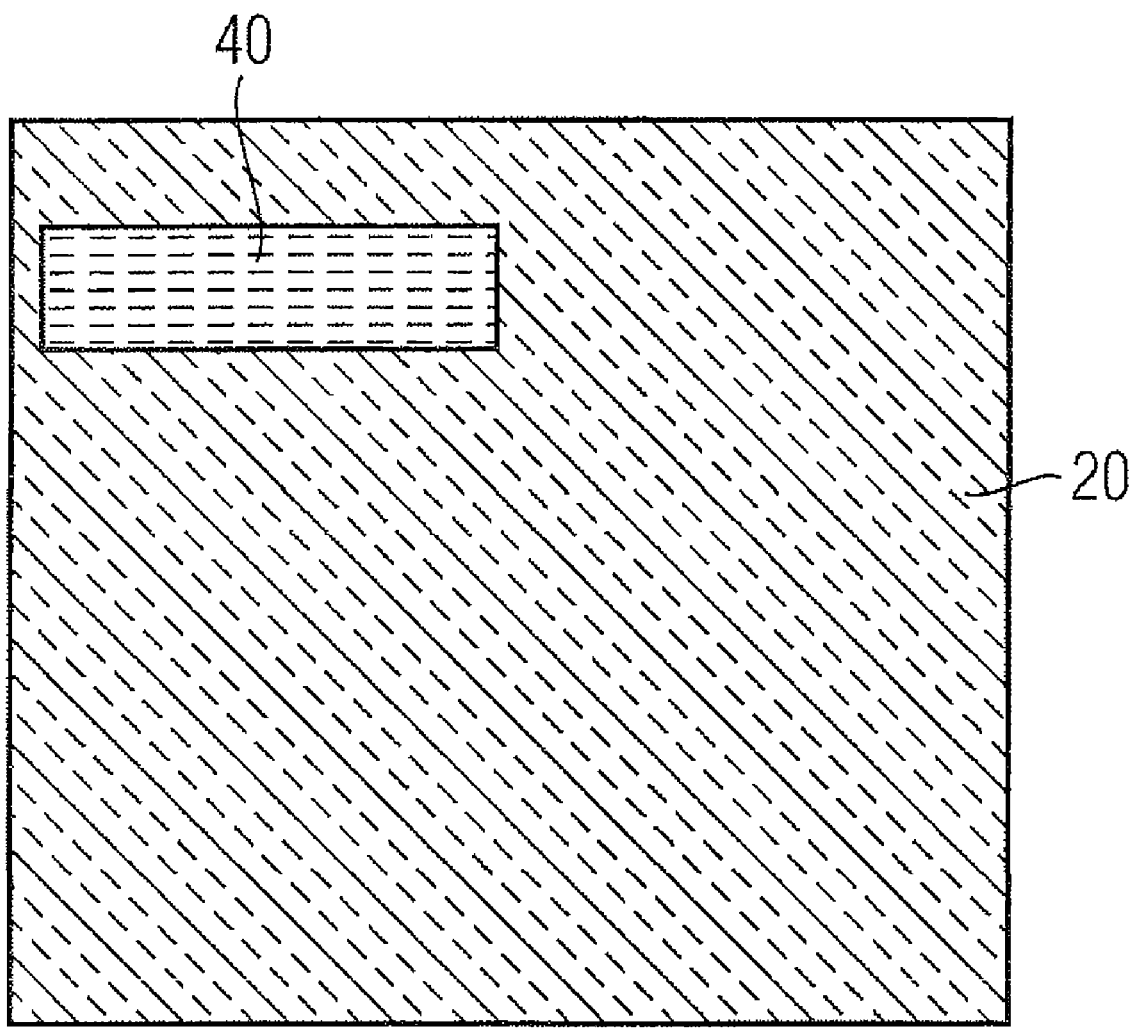

FIGS. 2A to 2C show a schematic plan view of the integrated circuit in accordance with the embodiment illustrated in FIG. 1A of the present invention in different stages during production. Firstly, FIG. 2A shows the wiring level 30 having the first conductor track 31 and the second conductor track 32 above the carrier substrate 10. As can be seen, within the wiring level, to produce a connection between the first conductor track 31 and the second conductor track 32, other conductor tracks may need to be crossed.

FIG. 2B shows the integrated circuit after the insulating layer having the first opening 21 and the second opening 22 have been applied to the wiring level. With regard to the application of the layer 20, reference is made to the description in connection with FIG. 1A. As can be seen, the first opening 21 may be arranged in a region of the first conductor track 31, while the second opening 22 may be arranged in a region of the second conductor track 32. Parts of the wiring level 30 that lie in between may be covered by the insulating layer 20.

FIG. 2C shows the integrated circuit after the contact bridge 40 has been applied. With regard to the application of the contact bridge 40, reference is made to the description in connection with FIG. 1A. As can be seen, contact may be made both with the first conductor track 31 in the region of the first opening 21, and with the second conductor track 32 in a region of the second opening 22. Therefore, the conductor tracks 31, 32 may be conductively connected without other units and/or conductor tracks being contact-connected.

FIGS. 3A to 3D show a schematic plan view of the integrated circuit in accordance with the embodiment illustrated in FIG. 1B of the present invention in different stages during production. Accordingly, the carrier substrate 10 may comprise an opening in a central region, as shown firstly in FIG. 3A. The integrated circuit component 50 fitted underneath—in this view—may therefore become visible and/or accessible. The integrated circuit component 50 may comprise contact areas 51, 52, 53, such as so-called bonding pads for example, at least also in said central region. The contact areas 51, 52, 53 of the integrated circuit component 50 may be connected to the corresponding conductor tracks of the wiring level 30 by means of a connection 80, for example by means of a so-called bonding wire.

In one embodiment, the first contact area 51 may be connected to the second contact area 52 within the integrated circuit component 50. This connection can have a significant electrical resistance across which a corresponding voltage is dropped in the event of a current flow through the connection. In order to reduce the resistance and to lower the voltage to a safe level, therefore, the first conductor track 31 may be short-circuited with the second conductor track 32 since, on the one hand, the first conductor track 31 is connected to the first contact area 51 via a connection 80 and, on the other hand, the second conductor track 32 is connected to the second contact area 52 via a connection 80. A direct short circuit between the first contact area 51 and the second contact area 52 may be impossible both at the chip level and within the wiring level 30 since either—as in the example shown—a further contact area 53 or a further conductor track 33 prevents this.

Figure 3A:
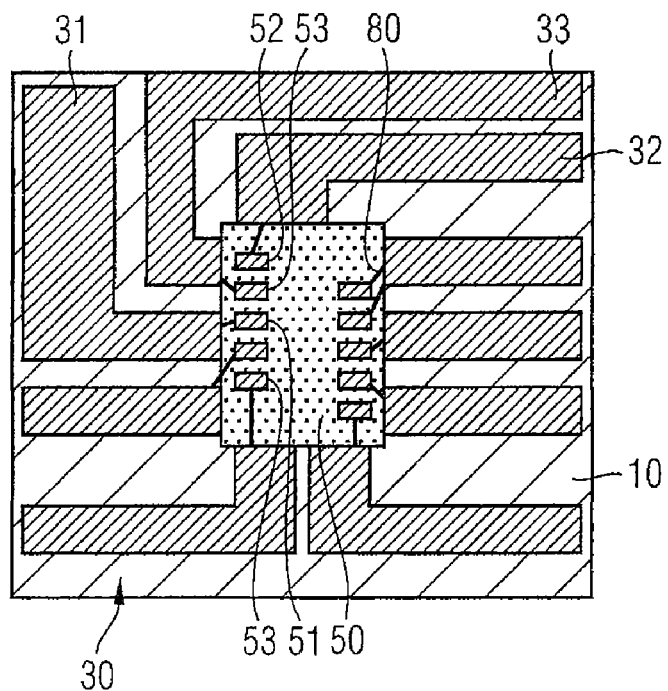
FIGS. 3A to 3D show a schematic plan view the integrated circuit according to the embodiment illustrated in FIG. 1B in different stages during production.
Figure 3B:
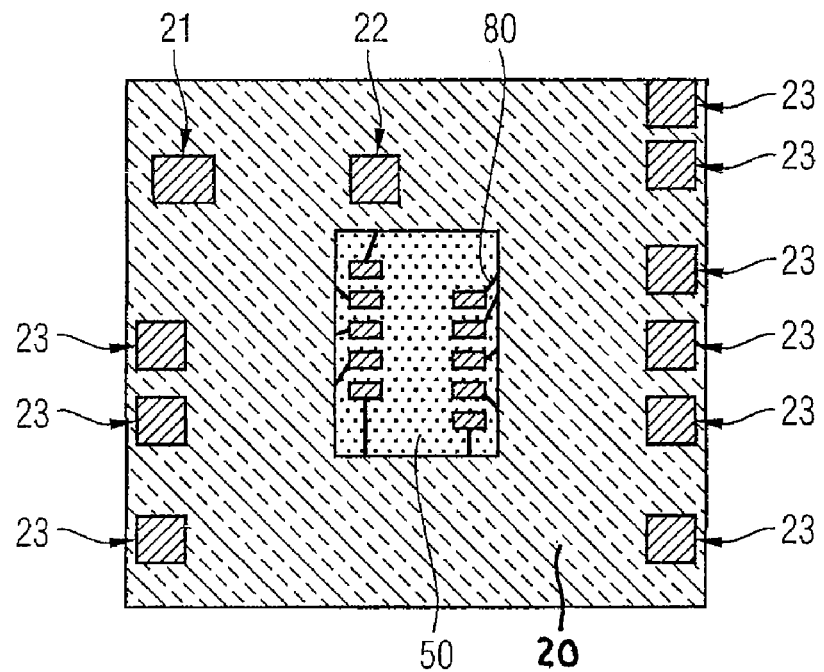

In order to provide a short circuit between the first conductor track 31 and the second conductor track 32, firstly the insulating layer 20 having the first opening 21 and the second opening 22 and further openings 23 may be applied to the wiring level 30, as shown as a schematic plan view in FIG. 3B. With regard to the application of the layer 20, reference is made to the description in connection with FIGS. 1A and/or 1B. The first opening 21 is in this case arranged in a region of the first conductor track 31 and the second opening 22 is in this case arranged in a region of the second conductor track 32. The further openings 23 may serve for the contact-connection of the further conductor tracks of the wiring level 30.

Figure 3C:
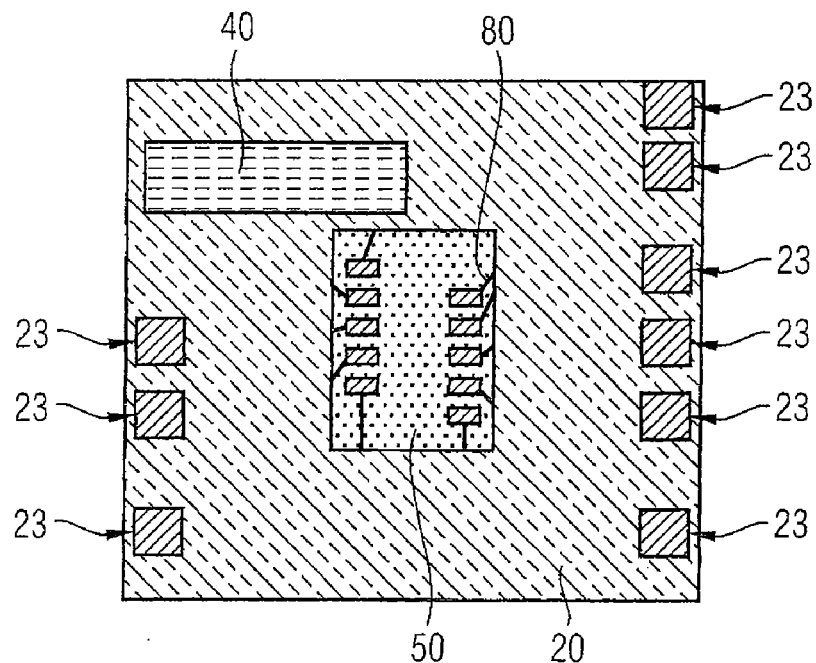

As shown in FIG. 3C, the contact bridge 40 composed of the second conductive material may be applied to the insulating layer 20, said material providing the short circuit between the first conductor track 31 and the conductor track 32, whilst avoiding a second wiring level. With regard to the application of the contact bridge 40, reference is made to the description in connection with FIG. 1A.

Figure 3D:
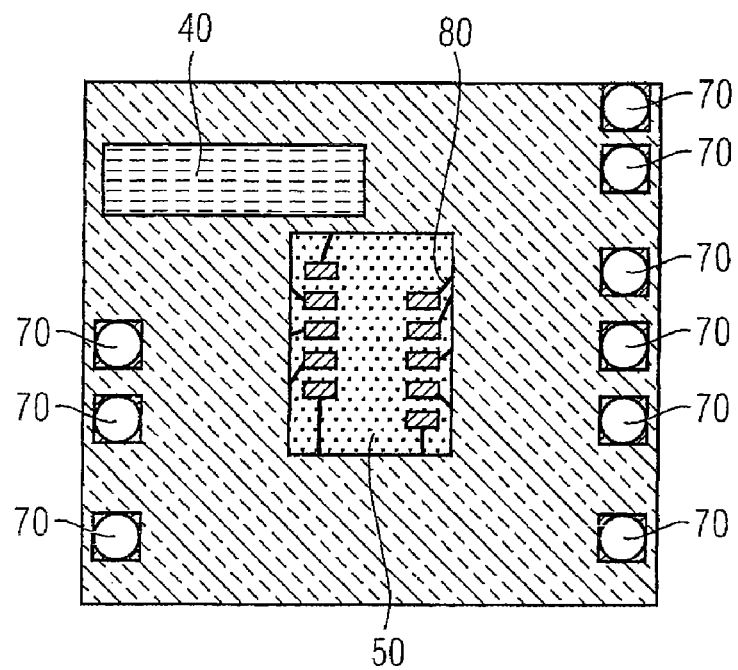

FIG. 3D shows a schematic plan view of a finished integrated circuit from the underside, in accordance with the embodiment illustrated in FIG. 1B of the present invention. Accordingly, solder balls 70 may be arranged on the further openings 23 of the insulating layer 20. The integrated circuit can now be connected to the rest of the circuit, for example a circuit of a motherboard or of a computer. This can be done for example with the aid of a printed circuit, in which case, on the one hand, the solder balls 70 contact-connect the conductor tracks of the wiring level 30 and thus the integrated circuit component 50 via the printed circuit to the further units of the circuit, for example a memory controller or microcontroller. On the other hand, an undesirable contact of the contact bridge 40 with parts of the integrated circuit or the further circuit is prevented, however. For this purpose, in the printed circuit conductor tracks can be insulated in a region opposite the contact bridge 40, or be routed around said region. The second conductive material can furthermore have a higher melting point than that of the metal solders used. Consequently, the contact bridge 40 may be preserved in a stable fashion even after reflow, infrared or flow soldering processes and does not form undesirable contact with the integrated circuit or parts of the printed circuit.

Figure 4:
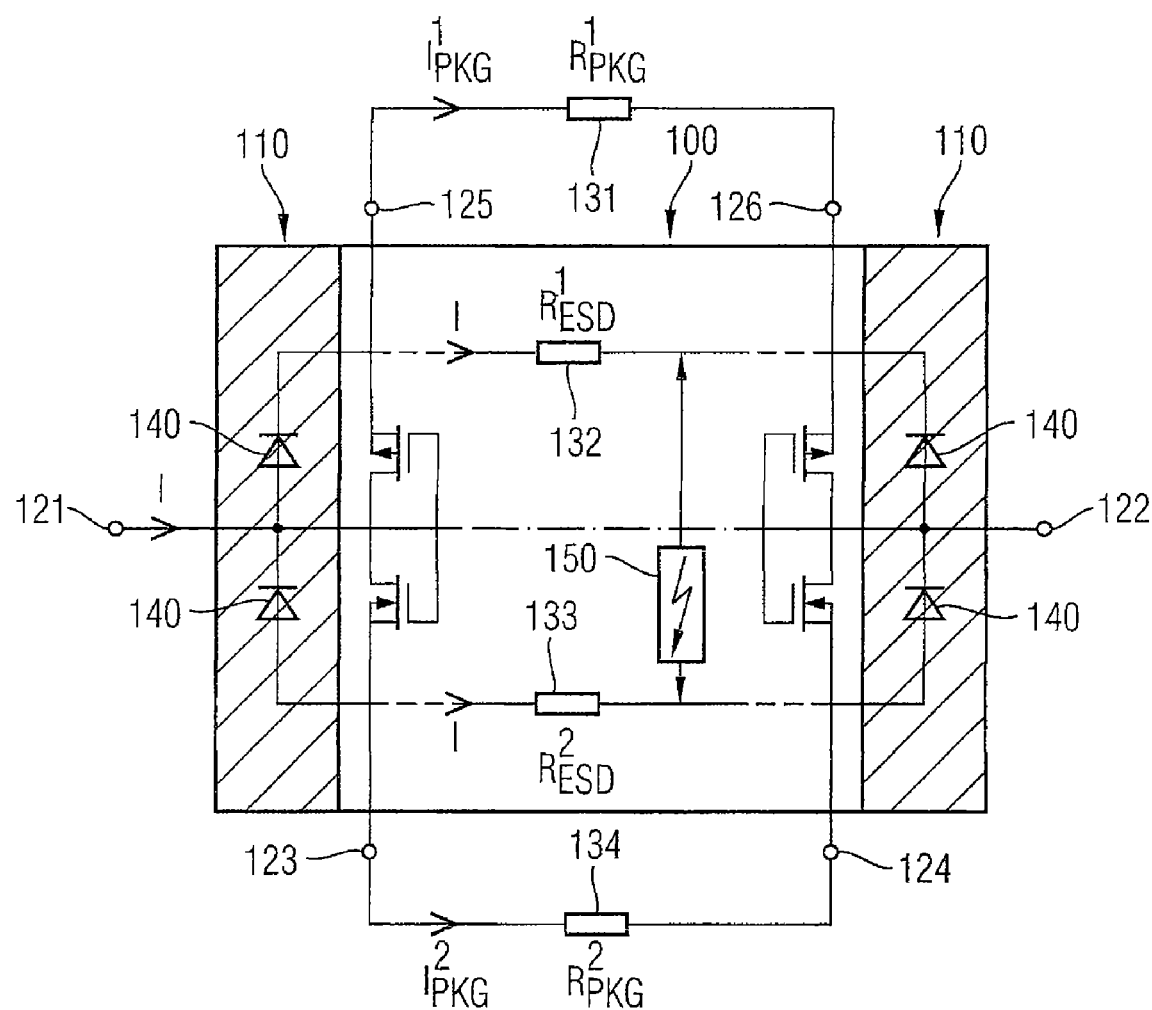
FIG. 4 shows a schematic circuit of an integrated circuit according to another embodiment of the present invention.

FIG. 4 shows a schematic circuit of an integrated circuit in accordance with another embodiment of the present invention. In this case, a functional part 100 of the integrated circuit may comprise the essential functional unit, for example a memory circuit, a memory cell array, or a microprocessor circuit. Additional ESD circuits 110 (electrostatic discharge), may have diodes 140 in order to conduct away a current/if appropriate from a first terminal 121 to a sixth terminal 126. A first resistor 131 and a second resistor 132 may be connected in parallel between the first terminal 121 and the sixth terminal 126. The same analogously holds true for a current that flows away for example from the first terminal 121 to a fourth terminal 124. A third resistor 133 and a fourth resistor 134 may be connected in parallel between said terminals.

Since the second resistor 132 and the third resistor 133 may be situated within the integrated circuit, they can have a high value. Therefore, a high harmful voltage component 150 can occur within the functional part 100 and can lead to damage to the integrated circuit or part of the functional part 100.

In accordance with the present invention, the second resistor 132 may be short-circuited with a contact bridge, illustrated here in the form of the first resistor 131. The same analogously holds true for a short circuit of the third and fourth terminals 123 and 124 with a corresponding contact bridge, illustrated as fourth resistor 134. The first resistor 131 and the fourth resistor 134 may be provided by the resistance of the contact bridge according to the invention, for example composed of conductive silver, and are therefore low. Therefore, the voltages dropped, in particular the voltage component 150, may be significantly reduced and the integrated circuit can be protected against electrostatic discharges in a cost-effective manner.

Within the meaning of the present invention it is possible to provide further substrates, layers, levels or elements between the carrier substrate and the wiring level and/or between the wiring level and the insulating layer. The arrangement of a wiring level above the carrier substrate or of the insulating layer above the wiring level should be understood for the corresponding orientation of the stack. Given correspondingly opposite orientation, the wiring level can also be arranged below the carrier substrate and the insulating layer can also be arranged below the wiring level.

The preceding description describes advantageous exemplary implementations. The features disclosed therein and the claims and the drawings can, therefore, be useful for realizing various implementations, both individually and in any combination. While the foregoing is directed to specific implementations, other and further implementations may be devised without departing from the basic scope, the scope being determined by the claims that follow.

What is claimed is:

1. An integrated circuit, comprising:
    a carrier substrate;
    a wiring level above a carrier substrate, wherein the wiring level comprises a first conductor track composed of a first conductive material and a second conductor track composed of the first conductive material;
    an insulating layer above the wiring level, wherein the insulating layer comprises a first opening in a region of the first conductor track of the wiring level and a second opening in a region of the second conductor track of the wiring level, wherein the insulating layer comprises a first insulating material and the carrier substrate comprises a second insulating material different from the first insulating material, wherein the first insulating material of the insulating layer comprises a soldering resist paste, and wherein the insulating layer comprises a further opening in a region of the first conductor track and a portion of solder is arranged in the further opening on the first conductor track; and
    a contact bridge composed of a second conductive material, wherein the contact bridge is connected to the first conductor track in a region of the first opening and is connected to the second conductor track in a region of the second opening.

2. The integrated circuit as claimed in claim 1, wherein the second conductive material comprises a conductive adhesive.

3. The integrated circuit as claimed in claim 1, wherein the second conductive material comprises conductive silver.

4. The integrated circuit as claimed in claim 1, wherein the first conductive material comprises any of copper, tin, bismuth and aluminum.

5. An integrated circuit, comprising:
    a carrier substrate;
    a wiring level arranged on a first surface of the carrier substrate, wherein the wiring level comprises a first conductor track and a second conductor track;
    an insulating layer above the wiring level, wherein the insulating layer comprises a first opening in a region of the first conductor track of the wiring level and a second opening in a region of the second conductor track of the wiring level, wherein the insulating layer comprises a further opening in a region of the first conductor track and a portion of solder is arranged in the further opening on the first conductor track;
    a contact bridge, wherein the contact bridge is connected to the first conductor track in a region of the first opening and is connected to the second conductor track in a region of the second opening, and wherein the first and the second conductor track of the wiring level are composed of a first conductive material, and the contact bridge is composed of a second conductive material that is different from the first conductive material; and
    an integrated circuit component arranged on a second surface of the carrier substrate, wherein the first surface and the second surface are opposite surfaces of the carrier substrate,
    wherein the carrier substrate comprises an opening from the first surface to the second surface, and
    wherein the integrated circuit component is connected to any of the first and the second conductor track of the wiring level by means of a connection in a region of the opening of the carrier substrate.

6. The integrated circuit as claimed in claim 5, further comprising:
    a housing that at least partly encompasses the integrated circuit component and the carrier substrate.

7. The integrated circuit as claimed in claim 5, wherein the second conductive material comprises a conductive adhesive.

8. The integrated circuit as claimed in claim 5, wherein the second conductive material comprises conductive silver.

9. The integrated circuit as claimed in claim 5, wherein the first conductive material comprises any of copper, tin, bismuth and aluminum.

* * * * *